United States Patent
Lin et al.

(10) Patent No.: US 7,078,307 B2
(45) Date of Patent: Jul. 18, 2006

(54) METHOD FOR MANUFACTURING SINGLE-SIDED BURIED STRAP IN SEMICONDUCTOR DEVICES

(75) Inventors: Shian-Jyh Lin, Yonghe (TW); Chia-Sheng Yu, Banciao (TW)

(73) Assignee: Nanya Technology Corp. (TW)

( * ) Notice: Subject to any disclaimer, the term of this patent is extended or adjusted under 35 U.S.C. 154(b) by 0 days.

(21) Appl. No.: 10/940,761

(22) Filed: Sep. 15, 2004

(65) Prior Publication Data

US 2005/0164446 A1   Jul. 28, 2005

(30) Foreign Application Priority Data

Jan. 28, 2004   (TW) .............. 93101800 A

(51) Int. Cl.
*H01L 21/20* (2006.01)

(52) U.S. Cl. .................................... 438/386

(58) Field of Classification Search ........ 438/243–249, 438/386–392, 381, 393, 396, 510, 514, 525; 257/301–305
See application file for complete search history.

(56) References Cited

U.S. PATENT DOCUMENTS

| | | | |
|---|---|---|---|
| 6,426,253 B1 * | 7/2002 | Tews et al. ................ | 438/243 |
| 6,426,526 B1 * | 7/2002 | Divakaruni et al. ........ | 257/302 |
| 6,750,116 B1 * | 6/2004 | Chen ........................... | 438/434 |
| 6,835,641 B1 * | 12/2004 | Yang et al. ................. | 438/597 |
| 6,916,721 B1 * | 7/2005 | Heineck et al. ............. | 438/389 |
| 2004/0029343 A1 * | 2/2004 | Seidl et al. ................. | 438/243 |
| 2005/0020024 A1 * | 1/2005 | Goldbach ................... | 438/386 |
| 2005/0054157 A1 * | 3/2005 | Hsu ........................... | 438/243 |
| 2005/0077563 A1 * | 4/2005 | Alsmeier ..................... | 257/301 |

FOREIGN PATENT DOCUMENTS

DE        10205077 A1 *   8/2003

* cited by examiner

*Primary Examiner*—Scott B. Geyer
(74) *Attorney, Agent, or Firm*—Michael Bednarek; Pillsbury Winthrop Shaw Pittman LLP

(57) ABSTRACT

A method for manufacturing a single-ended buried strap used in semiconductor devices is disclosed. According to the present invention, a trench capacitor structure is formed in a semiconductor substrate, wherein the trench capacitor structure has a contact surface lower than a surface of the semiconductor substrate such that a recess is formed. Then, an insulative layer is formed on a sidewall of the recess. Next, impurities are implanted into a portion of the insulative layer, and the impurity-containing insulative layer is thereafter removed such that at least a portion of the contact surface and a portion of sidewall of the recess are exposed. A buried strap is sequentially formed on the exposed sidewall of the recess to be in contact with the exposed contact surface.

8 Claims, 5 Drawing Sheets

METHOD FOR MANUFACTURING SINGLE-SIDED BURIED STRAP IN SEMICONDUCTOR DEVICES

BACKGROUND OF THE INVENTION

1. Field of the Invention

The present invention generally relates to a method for manufacturing semiconductor devices. More particular, the present invention relates to a method for manufacturing a single-sided buried strap in semiconductor devices.

2. Description of Related Arts

Dynamic random-access memory (DRAM) cells are composed of two main components, a storage capacitor that is used to stores electronic charge and an access transistor that is used to transfer the electronic charge to and from the storage capacitor. The storage capacitor may be either planar on the surface of the semiconductor substrate or trench etched into the semiconductor substrate. In the semiconductor industry where there is an increased demand for memory storage capacity accompanied with an ever decreasing chip size, the trench storage capacitor layout is favored over the planar storage capacitor design because this particular setup results in a dramatic reduction in the space required for the capacitor without sacrificing capacitance.

A very important and extremely delicate element in the DRAM cell is the electrical connection made between the trench storage capacitor and the access transistor. Such a contact is often referred to in the art as a buried strap formed at the intersection of one electrode of the storage trench capacitor and one source/drain junction of the access transistor. Referring to FIGS. 1A–1C, a conventional method for manufacturing a buried-strap at the intersection of the trench storage capacitor and the access transistor is schematically illustrated. By the masking of a patterned silicon nitride ($Si_3N_4$) pad layer 102, a trench 104 is formed into a semiconductor substrate 100 using dry etching techniques well known to those skilled in the art. An isolation collar 106 is formed on lower sidewalls of the trench 104 as shown in FIG. 1A. A layer of doped polysilicon 108 is sequentially filled into the lower portion of the trench 104, which is followed by conformal formation of a silicon nitride layer 110 and an amorphous silicon layer 112. By a tilt angle, impurities 114 are implanted into a portion of the amorphous silicon layer 112. On account of etch selectivity between impurity-containing and undoped portions of the amorphous silicon layer, the impurity-containing portion of the amorphous silicon layer 112 remains after an etch process is applied to remove the undoped portion of the amorphous silicon layer 112 as shown in FIG. 1B. Then, the silicon nitride layer 110 and the polysilicon layer 108 are sequentially patterned using the amorphous silicon layer as a masking film such that a portion of the isolation collar 106 can be exposed. In FIG. 1C, a layer of insulative material 116 is formed on a portion of upper sidewalls of the trench 104 using deposition and etching, both of which are well-known to those skilled in the art. The amorphous silicon layer 112 and the silicon nitride layer 110 are thereafter removed such that a buried strap 118 is formed.

The contact resistance of the buried strap is a critical parameter for DRAM cells. However, the contact resistance of the buried strap in accordance with the conventional method cannot be well controlled.

SUMMARY OF THE INVENTION

Therefore, it is an object of the present invention to provide a method for fabricating a single-sided buried strap in semiconductor device with well-controlled contact resistance.

It is another object of the present invention to provide the method for fabricating the single-sided buried strap in the semiconductor devices with simplified process steps.

To attain the aforementioned objects, the present invention provided a method for manufacturing a single-ended buried strap used in semiconductor devices. The method comprising the following steps of: (a) forming a trench capacitor structure in a semiconductor substrate wherein the trench capacitor structure has a contact surface lower than a surface of the semiconductor substrate such that a recess is formed; (b) forming an insulative layer on a sidewall of the recess; (c) implanting impurities into a portion of the insulative layer; (d) removing the impurity-containing insulative layer such that at least a portion of the contact surface and a portion of sidewall of the recess are exposed; and (e) forming a buried strap on the exposed sidewall of the recess to be in contact with the exposed contact surface.

In addition, the present invention provides a method for manufacturing a single-ended buried strap, comprising the following steps of: (a) forming a trench capacitor structure in a semiconductor substrate wherein the trench capacitor structure has a contact surface lower than a surface of the semiconductor substrate such that a recess is formed; (b) forming an insulative layer on a sidewall of the recess; (c) implanting impurities into a portion of the insulative layer by a tilt angle; (d) etching the impurity-containing insulative layer such that at least a portion of the contact surface and a portion of sidewall of the recess are exposed; and (e) forming a buried strap on the exposed sidewall of the recess to be in contact with the exposed contact surface.

DETAILED DESCRIPTION OF THE PREFERRED EMBODIMENTS

Figure 1A:
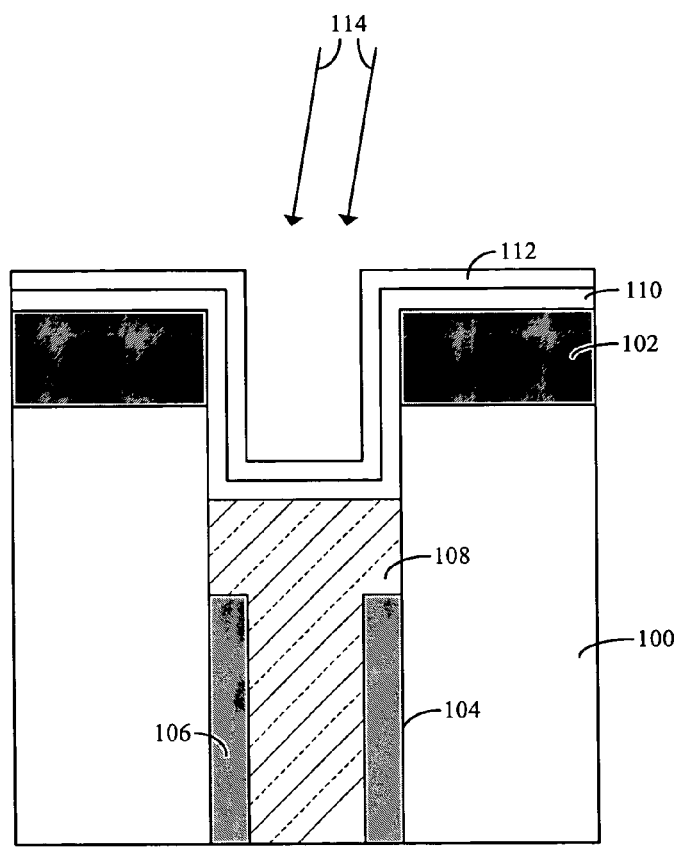
FIGS. 1A–1C schematically illustrate the process steps of a convention method for manufacturing a single-sided buried strap in cross-sectional views.
Figure 1B:
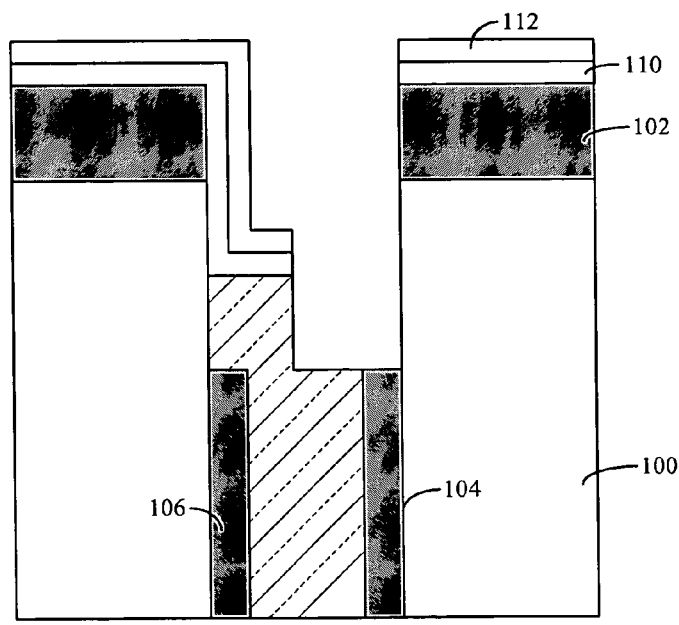
Figure 1C:
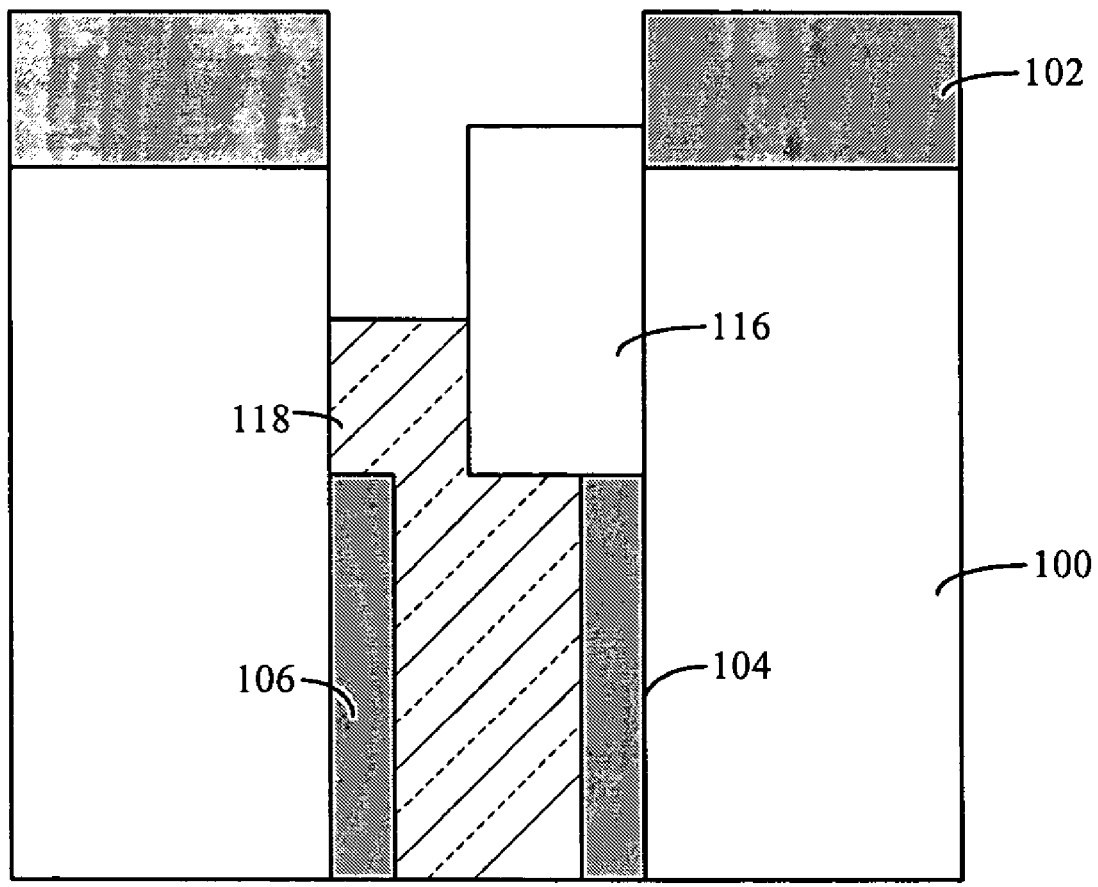

The present invention, which provides a process of manufacturing a single-sided buried strap in semiconductor devices, will now be described in greater detail by referring to the drawings that accompany this application. It is noted that in the various drawings like elements or components are referred to by like and corresponding reference numerals.

Figure 2A:
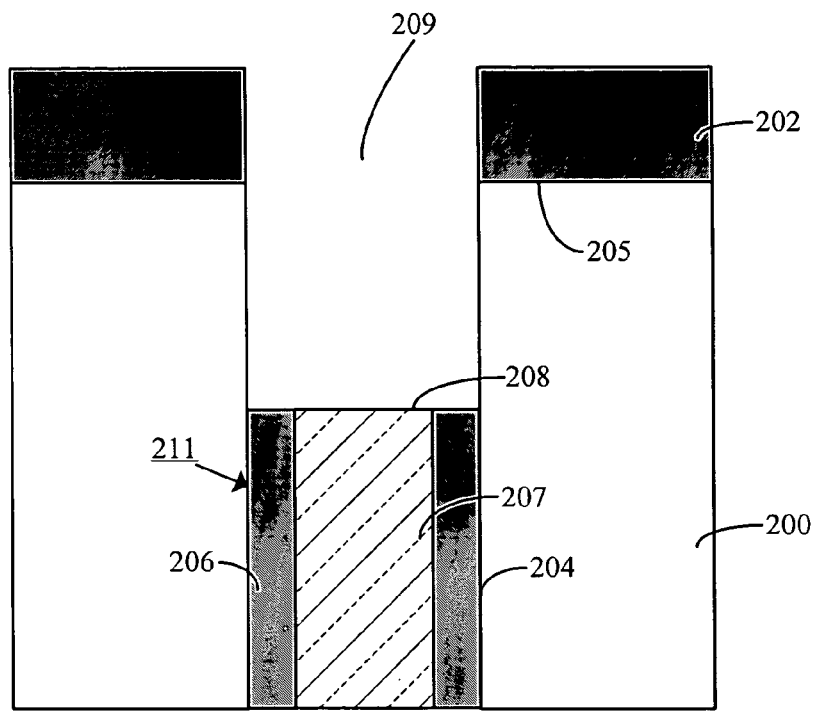
FIGS. 2A–2F schematically illustrate the process steps of a method for manufacturing a single-sided buried strap in accordance with the present invention in cross-sectional views.

Referring to FIGS. 2A–2F, the process steps of a method for manufacturing a single-sided buried strap in accordance with the present invention are schematically illustrated in cross-sectional views. A trench capacitor structure is formed in a semiconductor substrate 200; however, portions of the trench capacitor structure 211 are shown in consideration of simple and clear as well. The trench capacitor structure 211 comprises a trench 204 formed into the semiconductor substrate 200, an isolation collar 206 formed on lower sidewalls of the trench 104, and a doped polysilicon layer 207 filled in a portion of the trench and encircled by the isolation collar 206. The trench 204 is formed by using dry etch techniques while a patterned silicon nitride pad layer 202 as a hard mask. Thus, the trench capacitor structure 211 is provided with a surface 208 lower than the surface 205 of the semiconductor substrate 205 such that a recess 209 is formed as shown in FIG. 2A.

Figure 2B:
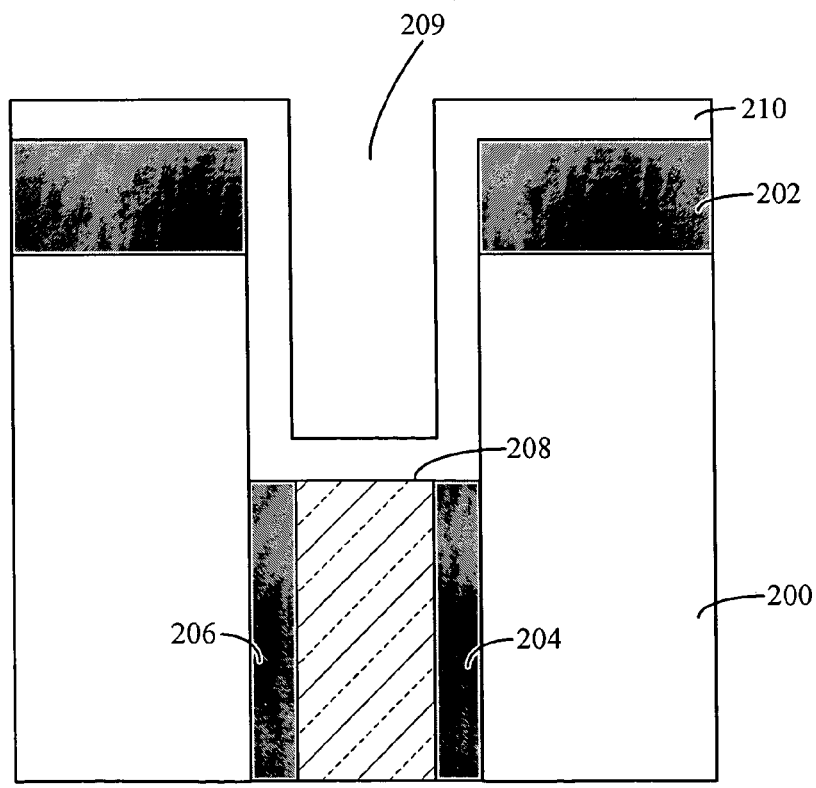
Figure 2C:
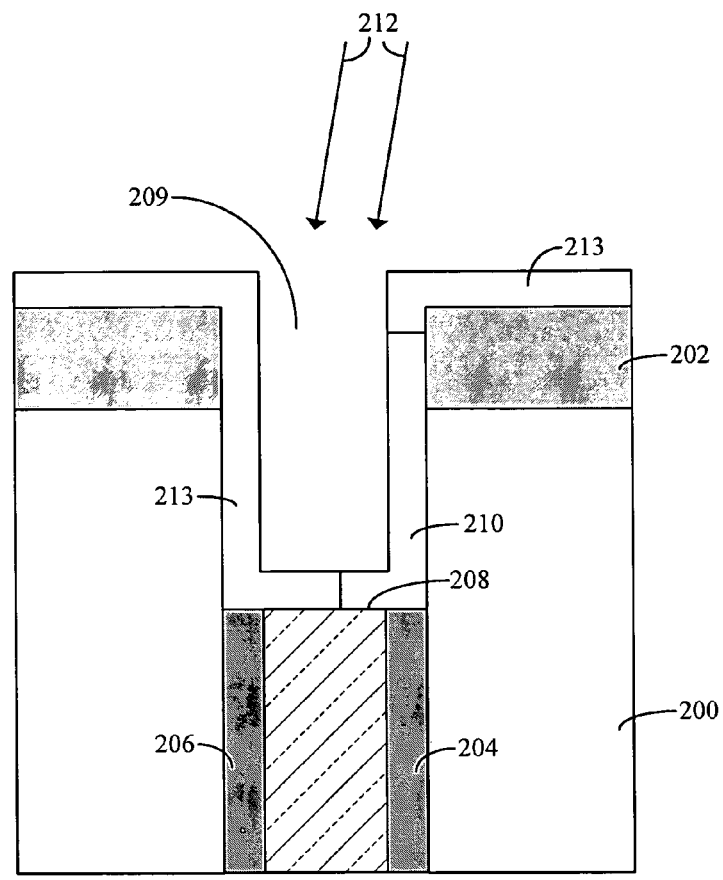

In FIG. 2B, an insulative layer 210 is conformably deposited on the silicon nitride pad layer 202 and in the recess 209. Alternately, an amorphous silicon layer can be conformably deposited on the silicon nitride pad layer 202 and in the recess 209, and then subject to oxidation so as to form the insulative layer 210. The insulative layer 210 that can be optionally employed in the present invention include, but not limited to, TEOS, $SiO_x$, $SiN_x$, $Si_3N_4$, SiON or other like materials which are capable of preventing the diffusion of impurities into the semiconductor substrate 200. As shown in FIG. 2C, impurities 212 are implanted, by a tilt angle, into a portion of the insulative layer 210 to form an impurity-containing insulative layer 213 on one side of the recess 209 and the silicon nitride pad layer 202. The impurities 212 that can be optionally employed in the present invention include, but not limited to, indium-containing, phosphorous-containing, arsenic-containing, nitrogen-containing, oxygen-containing or argon-containing ions. The tilt angle for ion implantation processes depends on the aspect ratio of the recess 209 and the exposed area of the contact surface 208. Usually, the greater the exposed area of the contact surface 208, the lower the contact resistance. Therefore, the lower contact resistance is contributive to access capability of the access transistors. In addition, the area size of the exposed contact surface 208 can be adjusted by different tilt angles during the ion implantation process. As an example, a first tilt angle (e.g., 7 degrees) followed by a second tilt angle (e.g., 11 degrees) can be applied to increase the area size of the contact surface 208.

Figure 2D:
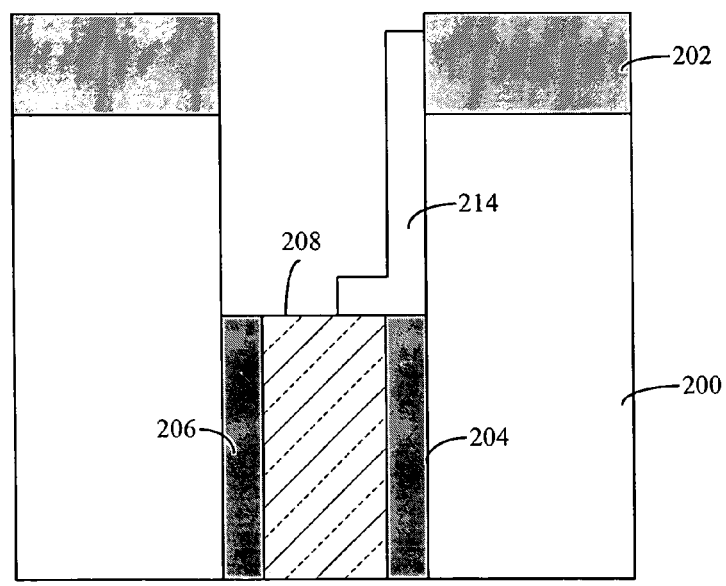
Figure 2E:
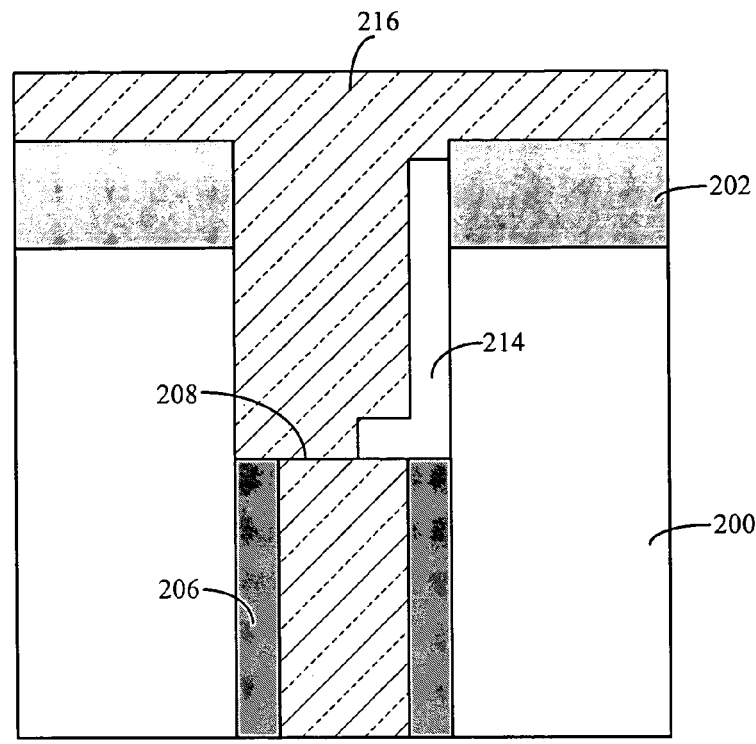
Figure 2F:
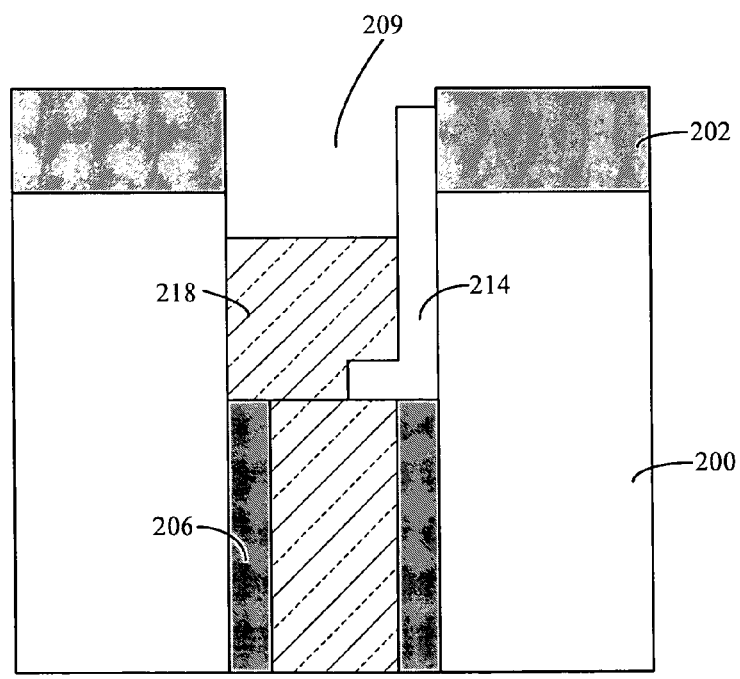

On account of significant etch selectivity between the impurities-containing insulative layer 213 and the undoped insulative layer 210, the impurities-containing insulative layer 213 can be selectively removed to expose a portion of the contact surface 208 while a single-sided insulative layer 214 remains as shown in FIG. 2D. The recess 209 is thereafter filled with conductive material 216 to be in electrical contact with the doped polysilicon layer 207 through the exposed contact surface 208 as illustrated in FIG. 2E. Next, conductive material 216 is subject to etch back process to form a single-sided buried strap 218 as shown in FIG. 2F. Preferably, the conductive material 216 can be optionally employed in the present invention include, but not limited to, doped polysilicon.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

The invention claimed is:

1. A method for manufacturing a single-ended buried strap, the method comprising the following steps of:

(a) forming a trench capacitor structure in a semiconductor substrate wherein said trench capacitor structure has a contact surface lower than a surface of said semiconductor substrate such that a recess is formed;

(b) forming an insulative layer overlying the contact surface of said trench capacitor structure and a sidewall of said recess in contact with said substrate within said recess;

(c) implanting impurities into a portion of said insulative layer;

(d) removing said impurity-containing insulative layer such that at least a portion of said contact surface and a portion of sidewall of said recess are exposed; and (e) forming a buried strap on said exposed sidewall of said recess to be in contact with said exposed contact surface.

2. The method as claimed in claim 1, wherein said insulative layer is made of material selected from the group consisting of TEOS, $SiO_x$, $SiN_x$, $Si_3N_4$, and SiON.

3. The method as claimed in claim 1, wherein said impurities are selected from the group consisting of indium-containing ions, phosphorous-containing ions, arsenic-containing ions, nitrogen-containing ions, oxygen-containing ions, and argon-containing ions.

4. The method as claimed in claim 1, wherein said buried strap is made of doped polysilicon.

5. A method for manufacturing a single-ended buried strap, the method comprising the following steps of:

(a) forming a trench capacitor structure in a semiconductor substrate wherein said trench capacitor structure has a contact surface lower than a surface of said semiconductor substrate such that a recess is formed;

(b) forming an insulative layer overlying the contact surface of said trench capacitor structure and a sidewall of said recess in contact with said substrate within said recess;

(c) implanting impurities into a portion of said insulative layer by a tilt angle;

(d) removing said impurity-containing insulative layer such that at least a portion of said contact surface and a portion of sidewall of said recess are exposed; and (e) forming a buried strap on said exposed sidewall of said recess to be in contact with said exposed contact surface.

6. The method as claimed in claim 5, wherein said insulative layer is made of material selected from the group consisting of TEOS, $SiO_x$, $SiN_x$, $Si_3N_4$, and SiON.

7. The method as claimed in claim 5, wherein said impurities are selected from the group consisting of indium-containing ions, phosphorous-containing ions, arsenic-containing ions, nitrogen-containing ions, oxygen-containing ions, and argon-containing ions.

8. The method as claimed in claim 5, wherein said buried strap is made of doped polysilicon.

* * * * *